United States Patent
Oglesbee et al.

[19]

[11] Patent Number: 6,054,843
[45] Date of Patent: Apr. 25, 2000

[54] HIGH SPEED BATTERY CHARGING SYSTEM WITH HIGH ACCURACY VOLTAGE SENSING

[75] Inventors: John W. Oglesbee, Watkinsville; Michael D. Geren, Suwanee, both of Ga.; Joseph Patino, Pembroke Pines, Fla.

[73] Assignee: Motorola, Inc., Schaumburg, Ill.

[21] Appl. No.: 09/240,478

[22] Filed: Jan. 29, 1999

[51] Int. Cl.[7] ........................................ H02J 7/00
[52] U.S. Cl. ............................................. 320/136
[58] Field of Search .................... 320/128, 134, 320/136, 150, 152, 164

[56] References Cited

U.S. PATENT DOCUMENTS

| | | | |
|---|---|---|---|
| 5,764,028 | 6/1998 | Freiman et al. | 320/134 |
| 5,825,155 | 10/1998 | Ito et al. | 320/134 |
| 5,903,137 | 5/1999 | Freiman et al. | 320/163 |
| 5,939,865 | 8/1999 | McGrath et al. | 320/156 |
| 5,955,865 | 9/1999 | Koike et al. | 320/104 |
| 5,965,991 | 10/1999 | Koike et al. | 318/139 |
| 5,969,625 | 10/1999 | Russo | 320/134 |
| 5,986,435 | 11/1999 | Koenck | 320/136 |

*Primary Examiner*—Edward H. Tso
*Assistant Examiner*—Pia Tibbits
*Attorney, Agent, or Firm*—Felipe S. Farley; Philip Burrus

[57] ABSTRACT

A battery charging system 100 is provided which comprises a charger 101 and a battery pack 102. The battery pack 102 comprises a battery cell or cells 150, memory means 140, temperature sensing means 147, and a high accuracy, high impedance voltage sensing means 112 that senses voltage directly at the battery cell terminals 151, 149. By sensing directly at the cell terminals 151, 149, charging error due to parasitic conductor impedances 132, 138 can be eliminated. The voltage sensing means 112 allows memory 140 and thermistor 147 data to be multiplexed, allowing the system to operate with four or fewer battery terminals.

7 Claims, 4 Drawing Sheets

HIGH SPEED BATTERY CHARGING SYSTEM WITH HIGH ACCURACY VOLTAGE SENSING

TECHNICAL FIELD

This invention relates in general to rechargeable batteries and battery chargers. More specifically, to operative rechargeable battery systems for facilitating battery charging.

BACKGROUND

Portable devices depend upon batteries as a power source. As the power consumption demands of these electronics devices is continually increasing, so is the need for high capacity batteries with long storage life. Depending upon the chemistry, rechargeable batteries comprise different characteristics. For example, one of the earliest rechargeable chemistries, Nickel Cadmium (Ni-Cad), are very robust and inexpensive, but have very poor capacity to weight ratios that result in large bulky batteries. Another later technology, Nickel Metal Hydride (Ni-MH), proved to be smaller, but offered no significant increase in the capacity to weight ratio.

Lithium, including Lithium Ion (Li-Ion) or Lithium Polymer (Li-P), batteries made a substantial leap in energy capacity per unit weight. With the advent of lithium cells, batteries became much smaller with greater capacities, as well as gaining superior storage capacity characteristics. The downside of lithium, however, involves safety. If lithium batteries are charged improperly or over charged, they can rapidly release gas at excessive temperatures, which can cause fire or explosion. Therefore, lithium battery chargers must precisely regulate the charging of such batteries. This precise charging regulation, however, in no way diminishes the need for very rapid charging algorithms.

Charging voltage must be precisely controlled in lithium battery chargers. If too much voltage is applied, battery cycle life will be degraded, and safety concerns may arise. There is thus a need for more accurate voltage sensing means in lithium battery charging systems.

In addition to a battery cell, lithium battery packs may also include memory devices. The memory devices are typically Electrically Programmable Read Only Memory (EPROM). These devices contain information that is used by the charger including identification, cycle data, etc. Also, battery packs contain thermistors for sensing temperature. Typically, lithium battery packs utilize four contact terminals: a positive voltage terminal, an EPROM data terminal, a thermistor terminal and a return terminal. Any means of more accurate voltage sensing, in order to me commercially viable, must add no new terminals to batteries.

It has been shown that accurate sensing of the cell voltage enhances the safety of charging lithium batteries. In addition, it has been shown that accurately measuring cell voltage reduces battery charge time by as much as 40%.

The net result is the need for an improved battery charging system.

SUMMARY OF THE INVENTION

This invention is a battery charging system that accurately senses the cell voltage of the battery, thereby reducing charging impedance errors associated with battery components. The invention further incorporates switch circuitry that facilitates multiplexing the voltage sense data with other battery components, including memory and temperature sensing. The result is a highly accurate charging system that utilizes only four battery terminals.

DETAILED DESCRIPTION OF THE INVENTION

While the specification concludes with claims defining the features of the invention that are regarded as novel, it is believed that the invention will be better understood from a consideration of the following description in conjunction with the drawings, in which like reference numbers are carried forward.

Figure 1:
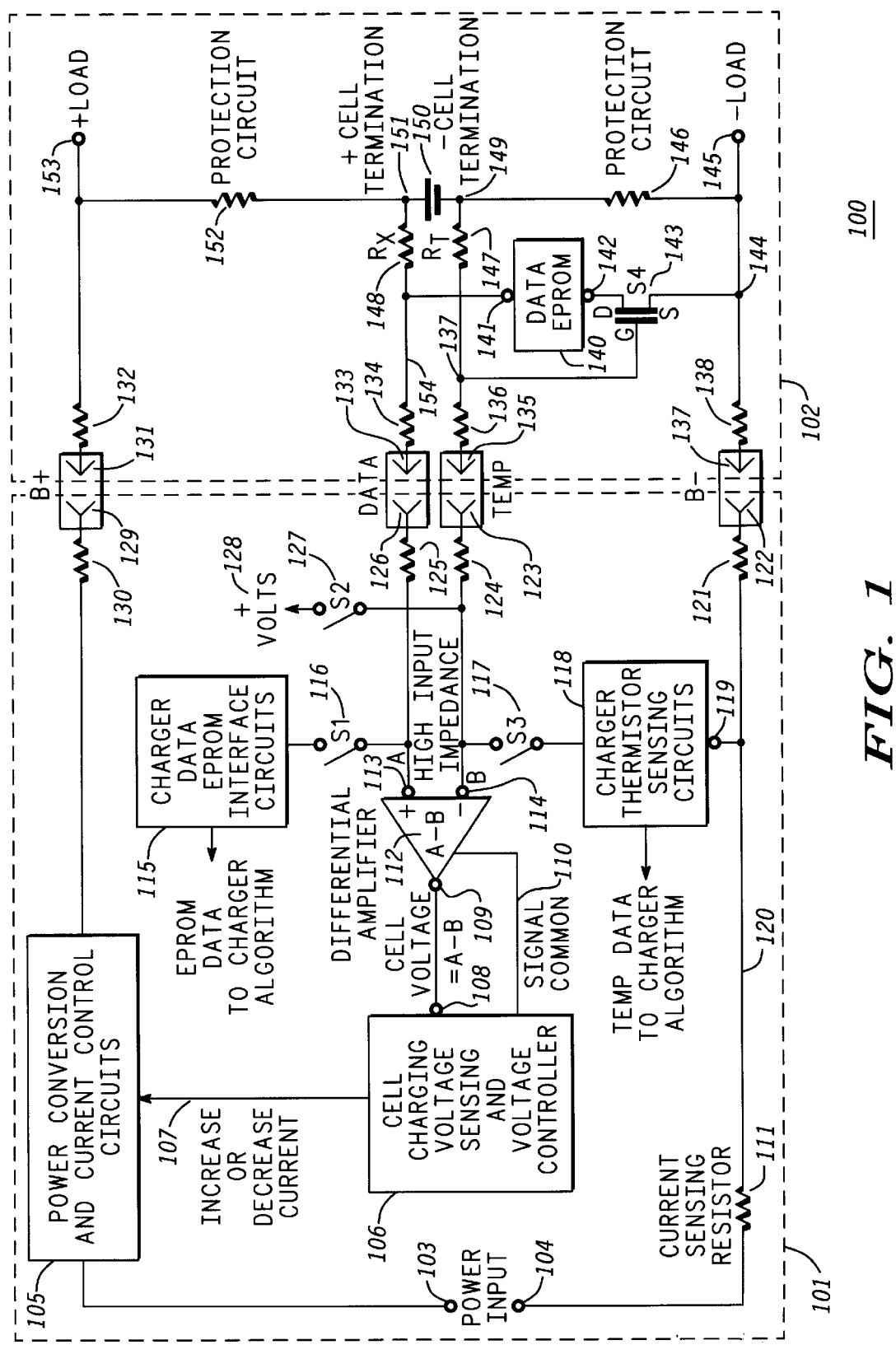
FIG. 1 is a schematic diagram of the battery charger system having a battery pack and charger according to the present invention.

Referring to FIG. 1, there is illustrated therein a battery charging system 100 including a battery 102 and a charger 101 in accordance with the invention. Both the charger 101 and battery 102 comprise four interface terminals 122 and 137, 123 and 135, 126 and 133, 129 and 131 that transmit power and data back and forth from battery 102 to charger 101 and vice versa.

The charger 101 is drawn to show a power supply, which is considered to be a switch-mode type, with a power source 104 and a power conversion unit 105 for converting the voltage and current levels. The converter 105 is controlled with a cell voltage sensing and voltage controlling controller 106 which takes a feedback signal from the cell and then generates a duty cycle transmitted to the conversion module 105 through connector 107.

The charger 101 further illustrates two interface circuits: a memory interface circuit 115 and a thermistor interface circuit 118. These circuits are generally translators that convert raw data from the memory 140 and thermistor sensor 147 into coherent data that can be used by the controller 106.

The battery diagram 102 is drawn to include an energy storage cell 150 and impedances due to protection circuitry 152 and 146. In addition, the battery 102 is shown also include a memory device 140. The devices generally used in lithium circuits are Electrically Programmable Read Only Memory (EPROM). These devices contain information that is used by the charger including identification, cycle data, etc.

Typically, lithium battery packs utilize four contact terminals: a positive voltage terminal 131, an EPROM data terminal 133, a thermistor terminal 135 and a return terminal 137. Any means of more accurate voltage sensing, in order to be commercially viable, must add no new terminals to batteries.

Both circuits illustrate several parasitic impedances associated with the system. These impedances are made up of several different components including (but not limited to) the trace resistances of the charger 130 and 121, conductors between the battery contacts and the voltage measurement nodes 125 and 124, the trace resistances of the battery pack conductors between the charging contacts and the protection circuitry 132 and 138, and the impedance associated with the typical battery pack protection circuits 152 and 146.

Conventional chargers have been limited by the fact that the voltage of the cell 150 has been measured not at the cell terminals 151 and 149, but rather at the terminals of the charger interface 129 and 122. The effect is that the impedances associated with the battery generate errors in the measurement of the cell voltage. For example, the current to charge a battery can be as high as several amps. If the sum of the series impedances is 0.2 ohms, and the charge current is 1 amp, then a 200 mV error is introduced into the cell measurement.

FIG. 1 illustrates a system 100 that allows direct and accurate measurement of the actual voltage across the terminals of the battery cell 150. This circuitry, which will be described in detail, allows the cell measurement to be made completely independent of any voltage errors caused by the various impedance elements between the charger 101 and the battery cell 150. The principal elements are the resistors Rx 148, Rt 147 and the high input impedance differential amplifier 112.

The physical layout of the battery 102 is shown such that Rx 148 and Rt 147 terminate directly at the battery cell terminals 151, 149. The circuit impedances between the termination points of Rx 148 and Rt 147 and the cell terminals 151, 149 are essentially zero. The terminations of Rx 148 and Rt 147 to the cell 150 are equivalent to "Kelvin connections" used in electrical voltage measurements as a method of improved accuracy. Using the resistors 148, 147, along with the differential amplifier 112, adapts this method to the specific circuit requirements for accurately charging batteries.

The voltage measurement technique is easily described with respect to FIG. 1 by visualizing that the memory element 140 and the memory interface circuitry 115 are all initially disabled. In addition, assume that the switches S1 116, S2 127, S3 117, and S4 143 are all open. The effect of these assumptions is, as these elements are inactive, the resulting active circuitry comprises simply two resistors 148, 147 connected serially between the battery cell terminals 151, 149 and the inverting and non-inverting inputs of the differential amplifier 113, 114.

The input impedance of the differential amplifier 112 is sufficiently high that no current flows into either input terminal 114, 113. If no current flows into the input terminals 114, 113, then no current flows in either resistor Rx 148 or Rt 147. Therefore, there is no voltage drop across these resistors 148, 147. As a result, the voltage across the terminals of the battery cell 150 is faithfully transferred to the inputs of the differential amplifier 113, 114. The output of the differential amplifier 109 is proportional to this voltage measurement, with the voltage referenced to the differential amplifier common node 110.

The circuit implementation of this invention is unique in that the voltage measurement methods do not preclude the utilization of the remainder of the battery circuits and interface circuits in their usual manner through their usual four terminals. For example, when the resistor Rt 147 comprises a thermistor, it can be easily used to measure the temperature of one or more battery cells 150. To measure temperature, S3 117 must be closed, while leaving S1 116 and S2 127 open. In so doing, the thermistor 147 and the thermistor interface circuits 118 share the same reference point, which is the return line 120. Temperature may then be sensed in a conventional fashion from Rt 147.

Data can also be read from the memory device 140 through the memory interface circuitry 115 in a conventional manner. To activate the memory function, it is necessary to close S1 116 and S2 127 while ensuring that S3 117 is open. When this occurs, several things happen. First, the gate of S4 139 is pulled high by the voltage source 128, which closes S4 143, creating a connection from the memory device's ground terminal 142 to the return line 120 which serves as a common ground between the battery 102 and the charger 101. Second, as the data output 141 is connected to the conductor from Rx to S1 154, a continuous path, neglecting trace resistances, is created between the data output of the memory 141 and the interface circuitry 115. The data can then be read in a conventional manner. The resistor Rx 148 is chosen with a high enough value that it does not affect the operation of the memory 140 and interface circuits 115.

The net impact of this invention is a charging system 100 which accurately measures cell voltage, thereby reducing charging times. Further, little additional cost is added to the battery and charger, as all conventional systems, e.g. memory 140 and thermistor 147, are maintained without adding more contacts to the battery pack.

Figure 2:
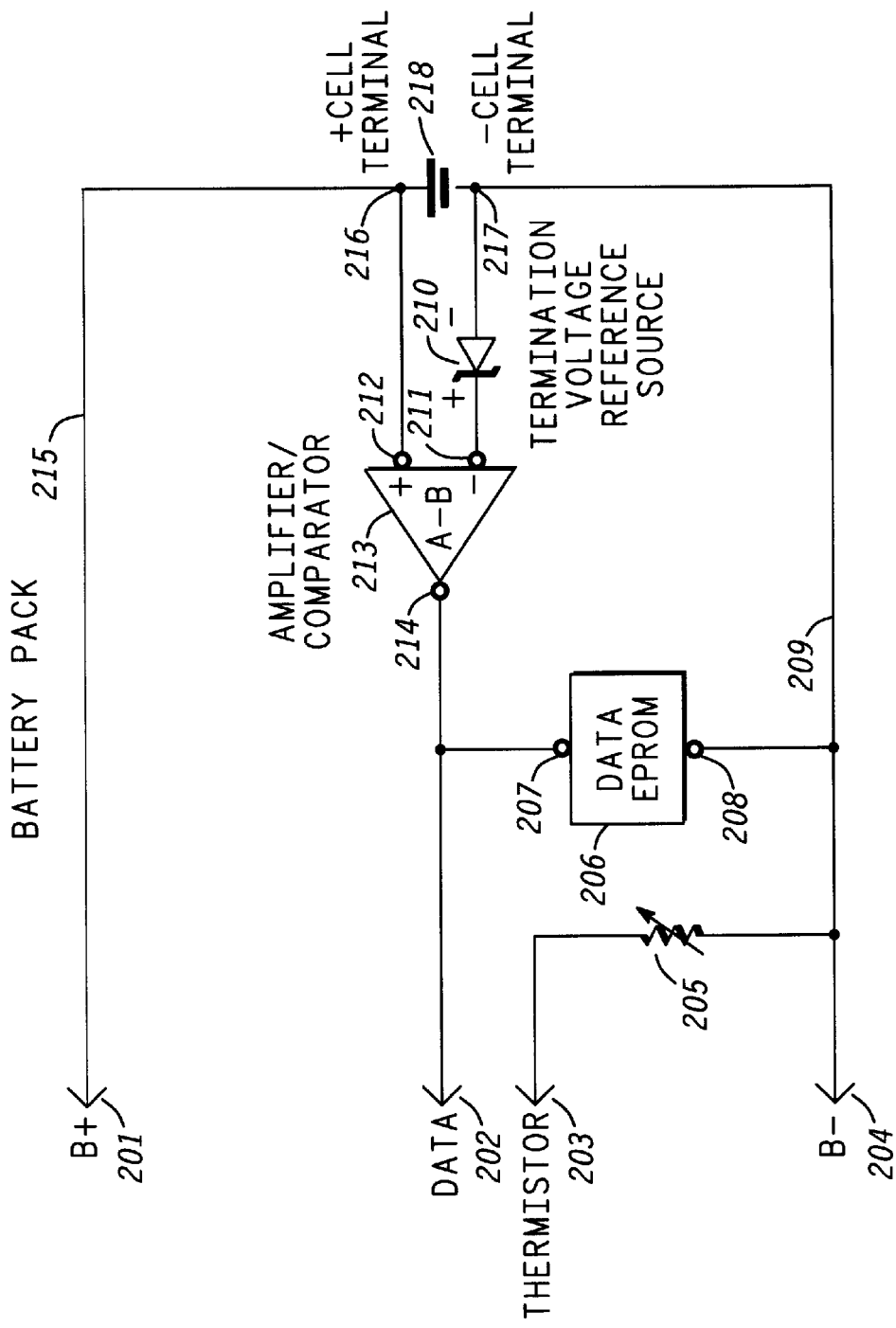
FIGS. 2, 3 and 4 are schematic diagrams of a further embodiments of the battery charging system having alternative voltage sensing means according to the present invention.

A second embodiment of the battery is shown in FIG. 2. This embodiment is appropriate to lower cost lithium battery charging systems in which some variation on/off control and/or reduced steps of charging current is adequate for charger control. For these types of chargers, it is not necessary to know the actual value of the cell voltage, but rather whether or not the voltage is greater or less than a predetermined cell termination level.

The charger circuitry is essentially the same in FIG. 2 as it is in FIG. 1, with one notable difference: In FIG. 2, there is no S2, S3 or S4. The battery is somewhat different in the fact that the voltage measurement circuit is essentially a comparator 213 and a voltage reference 210. The inverting input of the comparator 212 is connected to the positive terminal of the battery cell 216, while a voltage reference 210 is connected serially between the negative terminal of the battery cell 217 and the non-inverting input of the comparator 211.

This leads to charger functions that are somewhat different from those associated with FIG. 1. Regarding FIG. 2, the conversion means is simply turned on or off, depending upon the state of the output of the comparator 214. For instance, if the battery cell voltage is below the voltage of the reference, the output of the comparator 214 is high and the control means turns the conversion means into a short, which passes the power supply output directly to the battery.

As current is delivered to the cell 218, the voltage increases. When the voltage of the cell exceeds that of the reference, the comparator 213 goes low causing the control means to turn the conversion means into an open. Once the battery cell voltage drops below the reference's voltage, the cycle is repeated.

In this embodiment, the thermistor 205 is connected directly to the thermistor interface circuitry. This enables the charger to read the thermistor data at any time without having to close any switches. Further, when the charger wants to read memory data, it must simply close S1 to connect the memory to the memory interface circuitry, so that the data may be read.

This embodiment offers a more rudimentary charging scheme, but offers the advantage of reduced cost. It maintains the accurate means of sensing voltage as the comparator 213 and reference 210 are connected directly to the terminals of the battery cell 216, 217. It further offers the advantage of adding no additional interface connectors to the battery pack.

Figure 3:
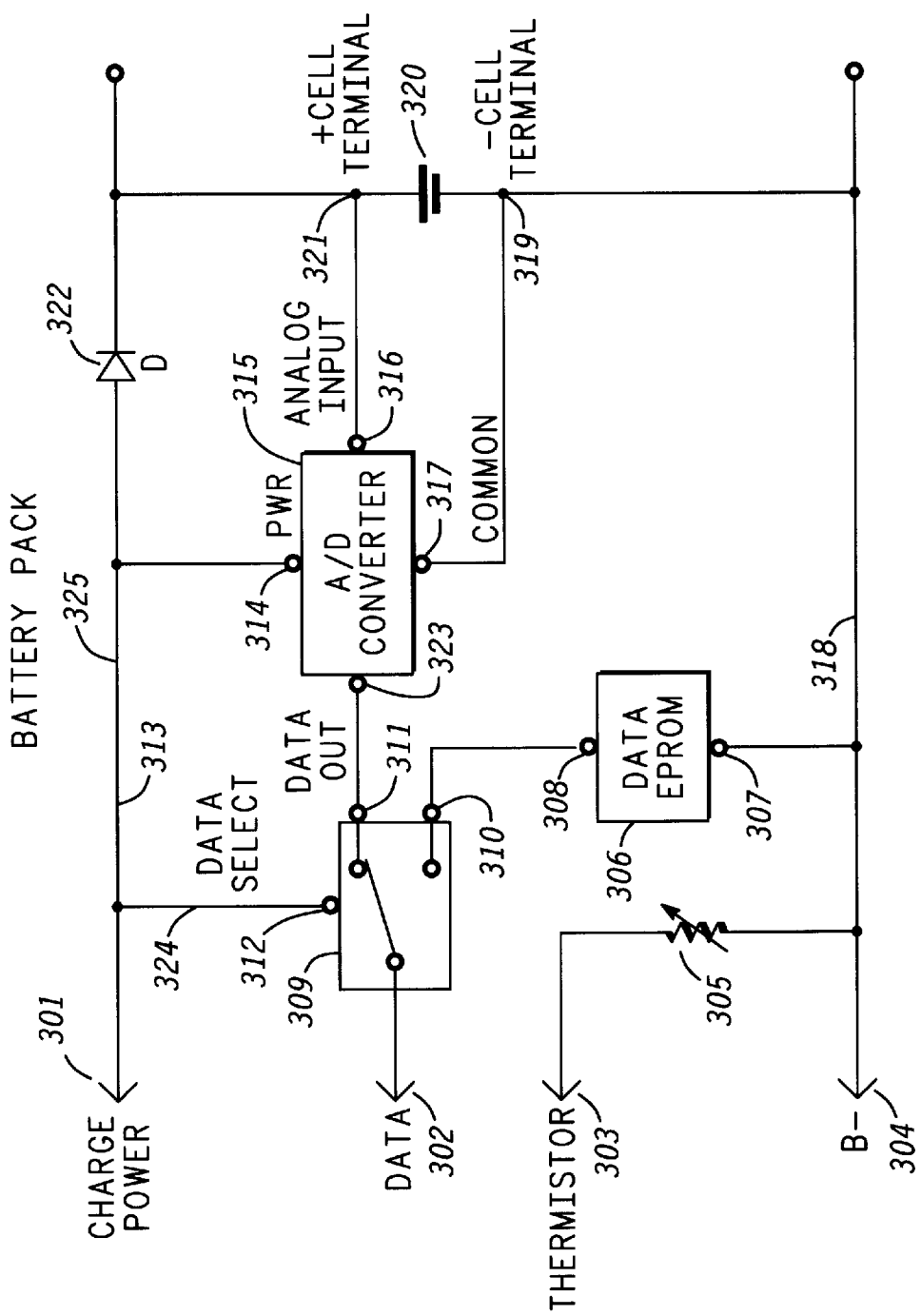

A third embodiment of the battery is shown in FIG. 3. Here, the battery pack is shown to include an analog to digital (A/D) converter 315, with the analog input 316 connected to the positive terminal of the cell 321 and the common input of the A/D converter 317 connected to the negative terminal of the battery cell 319. This A/D 315 constantly samples the battery voltage and converts it into binary form, which is then fed serially out the data output of the converter 323.

Another element that is unique to this embodiment is that the memory 306 and A/D converter 315 utilize the same interface circuitry. As both devices output serial binary data, this is logical.

This data from the A/D converter is connected to input A 311 of a 2:1 multiplexer 309. The memory device data output 308 is connected to input B 310 of the 2:1 multiplexer 309. The charger accesses this data as follows: If the charger wishes to read the output of the A/D converter which indicates the measurement of the cell voltage, it must simply cause the converter to produce an output voltage sufficiently high to cause the data select line 324 of the 2:1 multiplexer 309 to go high, which results in input A 311 being connected to the output of the multiplexer 302 and thus to the interface circuitry.

If the charger wishes to read memory data, then the control means must cause the conversion means to become an open. This causes the data select line 324 to fall low, enabling input B 310 to be connected to the output 302 which is then connected to the interface circuitry.

The A/D 315 is powered by the conversion means output 325. When the conversion means output 325 is off, i.e. when the control means wants to read the memory data, the A/D converter 315 will turn off. This is inconsequential and the A/D output 323 is of no interest during this time. A protection diode 322 had been added in series between the conversion means output 325 and the battery cell 320 to prevent the cell 320 from discharging into the charger. The voltage drop of this diode is of no consequence as the A/D converter 315 is connected directly to the battery cell terminals 321, 319.

As in FIG. 2, the thermistor 305 is connected in a dedicated fashion to the thermistor interface circuitry. The thermistor data can be read in a conventional fashion at any time.

Figure 4:
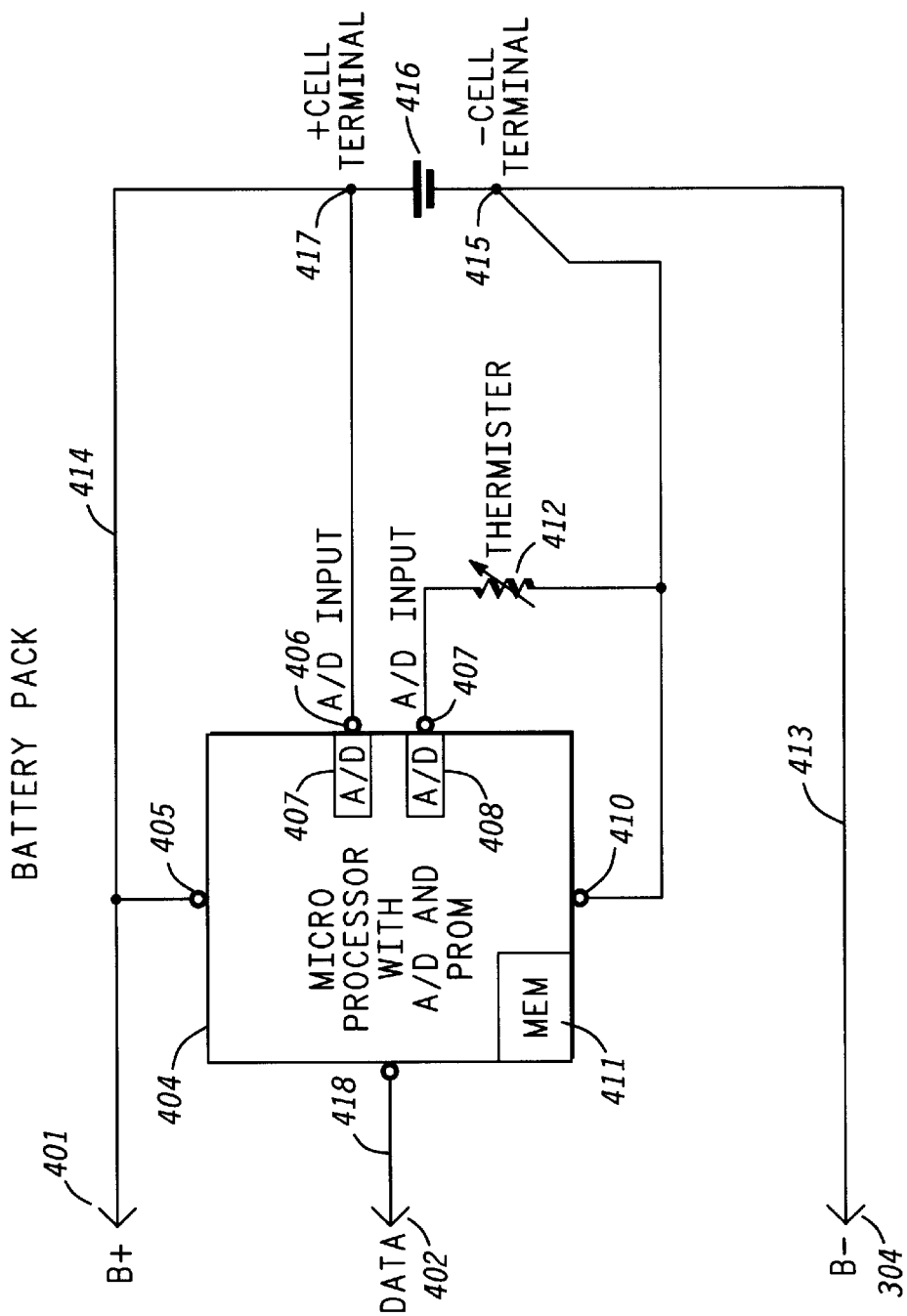

A fourth embodiment of this invention is shown in FIG. 4. Here, the battery is shown to include a microprocessor 404 with on board memory means 411 and two or more on board A/D converters 407, 408. Such a device 404 is common off the shelf and eliminates the need for multiple devices in the battery pack. This embodiment offers two distinct advantages: First, an electrical contact may be eliminated, as all data, i.e. memory, voltage sensing and thermistor, are communicated through a common data line 418. Second, any errors in the thermal sensing of the thermistor due to circuit conduction impedances are eliminated.

Referring to FIG. 4, the microprocessor 404 is powered continually from the battery cell 416. It may therefore continually convert data, although sleep modes may be employed to conserve battery power.

The first A/D input 406 is connected to the positive terminal of the battery 417. This A/D 407 converts the cell voltage into data to be transmitted back to the charger. A second A/D input 409 is connected to the thermistor 412 and is used for converting temperature data into digital form for transmission back to the charger. The microprocessor 404 would be duly programmed so as to multiplex the memory, cell voltage and thermistor data in an intelligent fashion across the data line 418.

While the preferred embodiments of the invention have been illustrated and described, it will be clear that the invention is not so limited. Numerous modification, changes, variations, substitutions and equivalents will occur to those skilled in the art without departing from the spirit and scope of the present invention as defined by the appended claims.

What is claimed is:

1. A system for charging a battery comprising
   (a) A power supply for providing power output having a return line;
   (b) A means for converting voltage and current levels;
   (c) A means for controlling power conversion means having one or more terminals;
   (d) A battery comprising
       Protection circuitry for opening a circuit under fault conditions;
       Memory circuitry for storing identification and instruction data;
       Temperature sensing means for sensing a temperature of one or more cells;
       An energy storage cell with positive and negative terminals;
       External terminals for power input and output and data;
   (e) Interface circuitry for interpreting data from said memory means and said temperature sensing means;
   (f) A means for accurately sensing voltage directly at the positive and negative terminals of said battery cell;
   (g) A switch means comprising at least four switches, S1, S2, S3 and S4 wherein
       Opening all four switches activates said voltage sensing means and deactivates both said memory means and said temperature sensing means;
       Closing S1 and S2 while opening S3 open activates said memory means and deactivates both said voltage sensing means and said temperature sensing means;
       Closing S3 and opening S1 and S2 activates said temperature sensing means and deactivates both said voltage sensing means and said memory means;
       S4 is connected as to be closed when both S1 and S2 are closed and otherwise be open.

2. A device as described in claim 1 wherein the external terminals for power input and output of data comprise a number selected from the group consisting of 1, 2, 3, or 4 terminals.

3. A device as described in claim 2 wherein a series resistor connected between the negative terminal of said energy storage cell and the inverting input of said high input impedance differential amplifier comprises a thermistor.

4. A device as described in claim 1 wherein the means for sensing voltage comprises a high input impedance differential amplifier with an output and inverting and non-inverting inputs with:
   The non-inverting input connected to the positive terminal of said energy storage cell through a series resistor;
   The inverting input connected to the negative input of said energy storage cell through a series resistor;
   The output connected to the power controlling means.

5. A device as described in claim 1 wherein the means for sensing voltage comprises
   A voltage reference source;
   A comparator with an output and an inverting and non-inverting input, wherein the inverting input is connected to the positive terminal of said energy storage cell, and the voltage source is connected in series with the negative terminal of said energy storage cell and the non-inverting input.

6. A device as described in claim 1 wherein

Said means for sensing voltage comprises an analog to digital converter with analog input connected to the positive terminal of said energy storage cell, and the return line connected to the negative terminal of said energy storage cell;

Said switch means comprises a 2-input, 1-output multiplexer with one input connected to the output of the analog to digital converter and the other input connected to said memory means.

7. A device as described in claim 1 wherein the means for sensing voltage comprises a microprocessor with on-board memory means and two or more on-board analog to digital converters wherein One analog to digital converter input is connected to the positive terminal of said energy storage cell;

One analog to digital converter input is connected to said thermal sensing means;

The return terminal of said microprocessor is connected to the negative input of said energy storage cell.

\* \* \* \* \*